(12) United States Patent
Kawabata

(10) Patent No.: US 7,906,095 B2
(45) Date of Patent: Mar. 15, 2011

(54) METHOD OF GROWING CARBON NANOTUBE AND CARBON NANOTUBE GROWING SYSTEM

(75) Inventor: Akio Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 200 days.

(21) Appl. No.: 12/146,841

(22) Filed: Jun. 26, 2008

(65) Prior Publication Data

US 2008/0260618 A1 Oct. 23, 2008

Related U.S. Application Data

(63) Continuation of application No. PCT/JP2005/023799, filed on Dec. 26, 2005.

(51) Int. Cl.
*D01F 9/12* (2006.01)

(52) U.S. Cl. ................... 423/447.1; 423/447.5

(58) Field of Classification Search ..... 423/447.1–447.9
See application file for complete search history.

(56) References Cited

U.S. PATENT DOCUMENTS

| | | | |
|---|---|---|---|
| 6,596,187 B2 * | 7/2003 | Coll et al. ......... | 216/56 |
| 6,761,871 B2 * | 7/2004 | Little ......... | 423/447.3 |
| 6,900,580 B2 | 5/2005 | Dai et al. | |
| 7,250,148 B2 * | 7/2007 | Yang et al. ......... | 423/447.3 |
| 2001/0019238 A1 | 9/2001 | Dai et al. | |
| 2005/0053542 A1 * | 3/2005 | Harutyunyan ......... | 423/447.3 |
| 2008/0031804 A1 * | 2/2008 | Taki et al. ......... | 423/447.7 |

FOREIGN PATENT DOCUMENTS

| | | |
|---|---|---|
| JP | 2002-530805 A | 9/2002 |
| JP | 2004-267926 A | 9/2004 |
| JP | 2005-1936 A | 1/2005 |
| JP | 2005-22886 A | 1/2005 |
| WO | 00/30141 A1 | 5/2000 |

OTHER PUBLICATIONS

International Preliminary Report on Patentability Form PCT/IB/338 mailed Aug. 13, 2009, issued in corresponding International Application No. PCT/JP2005/023799.

Francisco M. Morales et al; "Structural Study of Micro and Nanotubes Synthesized by Rapid Thermal Chemical Vapor Deposition," Microchim. Acta JN; vol. 145; No. 1/4; 2004; pp. 129-132; cited ISR.

Chien-Chao Chiu et al; "Synthesis of ultra long vertically aligned carbon nanotubes using the rapid heating and cooling system in the thermal chemical vapor deposition process," [online] Aug. 10, 2005; [Retrieval data Jan. 19, 2006]; cited ISR.

International Search Report of PCT/JP2005/023799, date of mailing Jan. 31, 2006.

* cited by examiner

*Primary Examiner* — Edward M Johnson
(74) *Attorney, Agent, or Firm* — Westerman, Hattori, Daniels & Adrian, LLP

(57) ABSTRACT

When growing carbon nanotubes, a substrate is delivered into a thermal CVD chamber whose internal temperature is a room temperature, and a mixed gas of an inert gas and a raw gas is introduced in the inside thereof. After a pressure inside of the chamber is stabilized at 1 kPa, the temperature in the chamber is raised to 510° C. in 1 minute. As a result, the carbon nanotubes start to grow linearly from the respective catalytic particles without any fusion of each of the catalytic particles.

Subsequently, the temperature and an atmosphere are maintained for about 30 minutes. Once the carbon nanotubes start to grow, surfaces of the catalytic particles are covered by carbon, so that any fusion of each of the catalytic particles can be avoided even during the maintenance for about 30 minutes.

13 Claims, 10 Drawing Sheets

US 7,906,095 B2

METHOD OF GROWING CARBON NANOTUBE AND CARBON NANOTUBE GROWING SYSTEM

TECHNICAL FIELD

The present invention relates to a method of growing a carbon nanotube and a carbon nanotube growing system.

BACKGROUND

Conventionally, in order to grow carbon nanotubes, a catalytic metal thin film is formed by a sputtering method or a vapor deposition method, and thereafter, the catalytic metal thin film is heated while introducing a reduction gas or an inert gas into a chamber, to thereby make the catalytic metal thin film be fine particles (For example, see Japanese Patent Application Laid-open Nos. 2004-267926 and 2002-530805). After that, a raw gas such as acetylene gas starts to be supplied into a chamber, and with the use of a thermal CVD method, a plasma CVD method, a hot filament CVD method or the like, the carbon nanotubes are grown.

However, such conventional methods include a problem that diameters of the growing nanotubes are not stabilized, so that characteristics of the carbon nanotubes tend to vary.

In terms of controlling the diameters of the carbon nanotubes, a method to grow carbon nanotubes using catalytic particles is described in Patent Document 3. However, even when applying the method described in Japanese Patent Application Laid-open No. 2005-22886, although the expected object is achieved, the variation of the diameters and the characteristics of the carbon nanotubes may arise.

SUMMARY

A manufacturing method of carbon nanotubes according to an aspect of the present invention comprises: adhering catalytic particles to an upper surface of a substrate; and raising a substrate temperature at a speed of 500° C./minute or faster in a chamber with a raw gas containing carbon atoms previously introduced therein.

A carbon nanotube growing system according to an another aspect of the present invention is provided with a catalyst adhering portion adhering catalytic particles to an upper surface of a substrate, and a thermal treatment portion raising a substrate temperature at a speed of 500° C./minute or faster in a chamber with a raw gas containing carbon atoms previously introduced therein.

DETAILED DESCRIPTION OF THE EMBODIMENTS

Hereinafter, embodiments of the present invention will be described in detail with reference to the attached drawings.

First Embodiment

First, a first embodiment will be explained. FIGS. 1A to 1F are sectional views showing a method of growing carbon nanotubes according to the first embodiment in order of step.

Figure 1A:
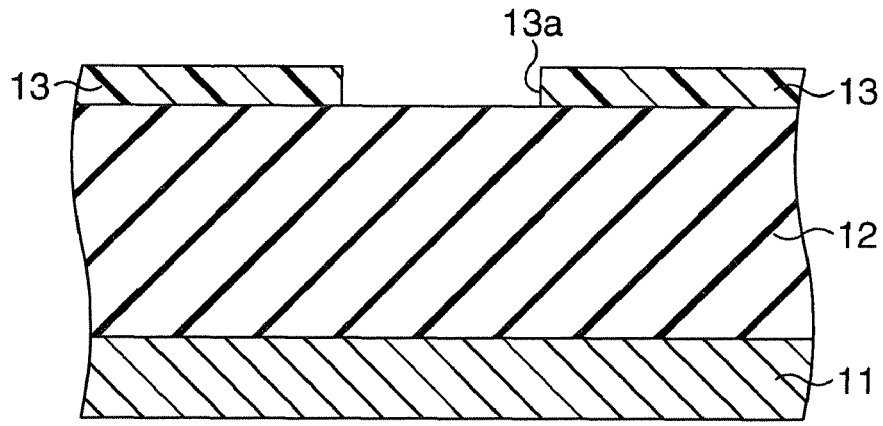
FIG. 1A is a sectional view showing a method of growing carbon nanotubes according to a first embodiment.

In the present embodiment, first, a silicon oxide ($SiO_2$) film 12 is formed on a silicon (Si) substrate 11, as shown in FIG. 1A. A thickness of the silicon oxide ($SiO_2$) film 12 is, for example, about 350 nm. Next, a resist pattern 13 having a circular opening portion 13a is formed on the silicon oxide ($SiO_2$) film 12. The opening portion 13a has a diameter of, for example, about 2 μm.

Figure 1B:
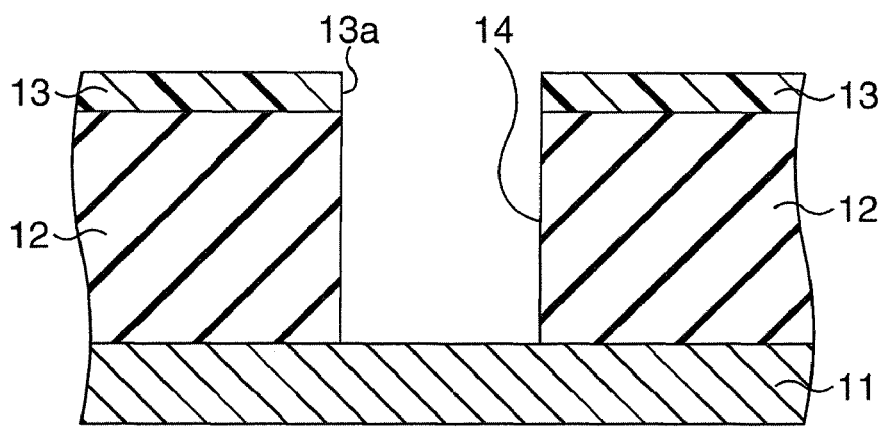
FIG. 1B is a sectional view showing the method of growing carbon nanotubes following FIG. 1A.

Subsequently, the silicon oxide ($SiO_2$) film 12 is patterned using the resist pattern 13. As a result, a cylindrical opening portion 14 is formed in the silicon oxide ($SiO_2$) film 12, as shown in FIG. 1B.

Figure 1C:
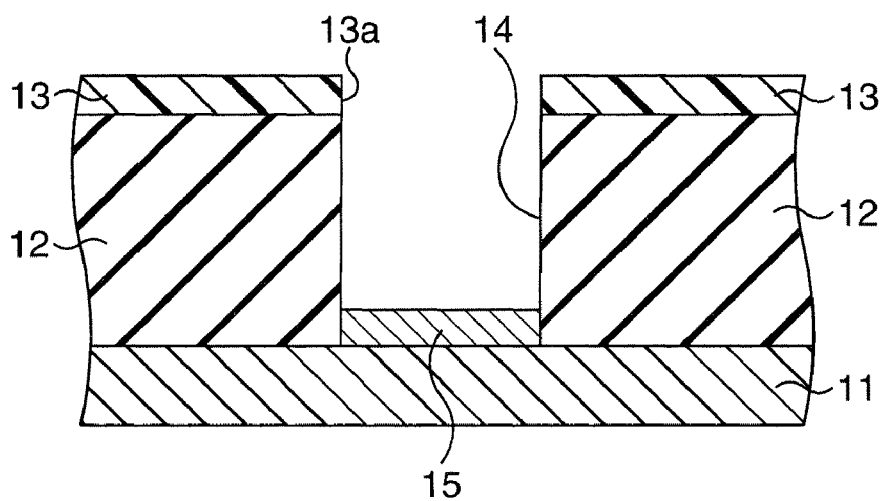
FIG. 1C is a sectional view showing the method of growing carbon nanotubes following FIG. 1B.

Thereafter, a catalytic layer 15 is formed at a bottom portion of the opening portion 14, as shown in FIG. 1C. As the catalytic layer 15, a titanium (Ti) film having about 1 nm in thickness, for example, is formed.

Figure 1D:
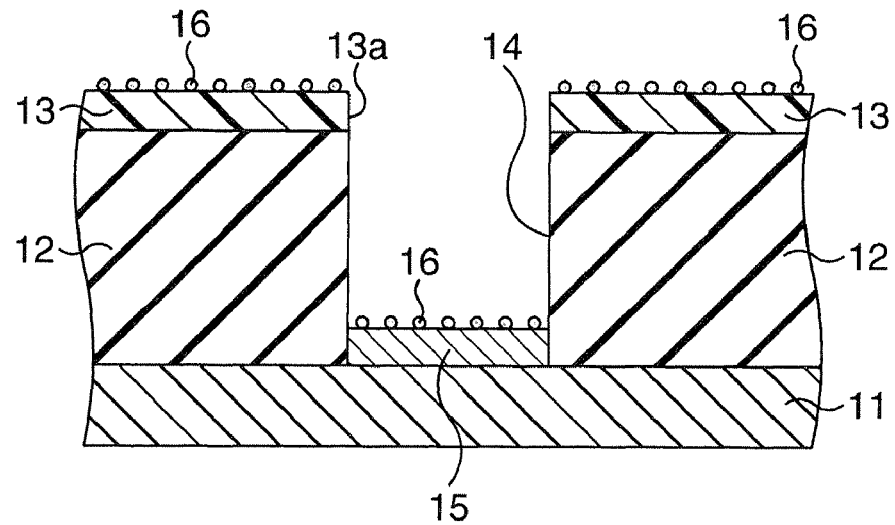
FIG. 1D is a sectional view showing the method of growing carbon nanotubes following FIG. 1C.

Next, a plurality of catalytic particles 16 having substantially uniform diameters are adhered on the catalytic layer 15, as shown in FIG. 1D. The catalytic particle 16 has a diameter of, for example, 5 nm or smaller. As the catalytic particles 16, cobalt (Co) particles, nickel (Ni) particles, or iron (Fe) particles are used, for example. It should be noted that alloy particles of these elements may also be used. The catalytic particles 16 may adhere on the resist pattern 13, as shown in FIG. 1D. A method for adhering the catalytic particles 16 is not limited in particular. For example, a method described in Japanese Patent Application Laid-open No. 2005-22886 may be applied.

Figure 1E:
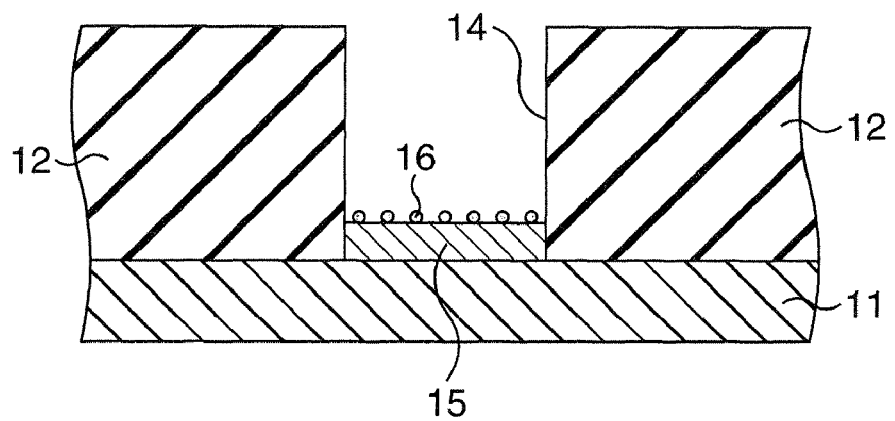
FIG. 1E is a sectional view showing the method of growing carbon nanotubes following FIG. 1D.

Next, the resist pattern 13 is removed by ashing or the like, as shown in FIG. 1E. As a result, even when being adhered on the resist pattern 13, the catalytic particles 16 are removed.

Figure 1F:
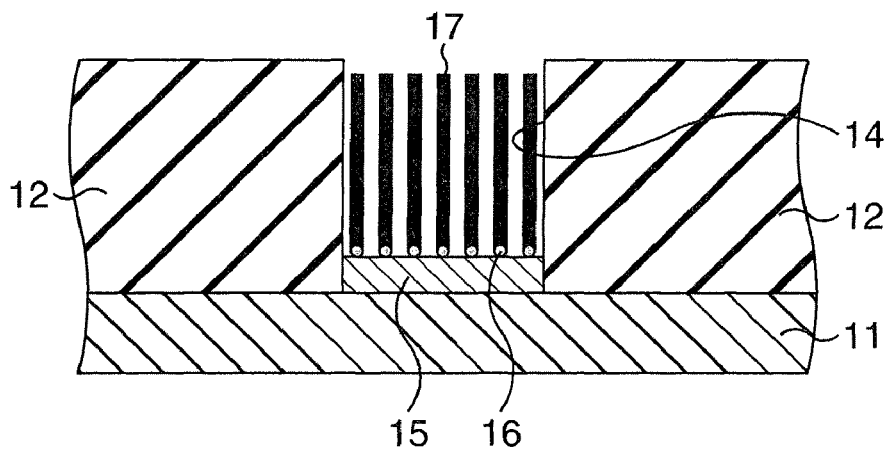
FIG. 1F is a sectional view showing the method of growing carbon nanotubes following FIG. 1E.
Figure 2:
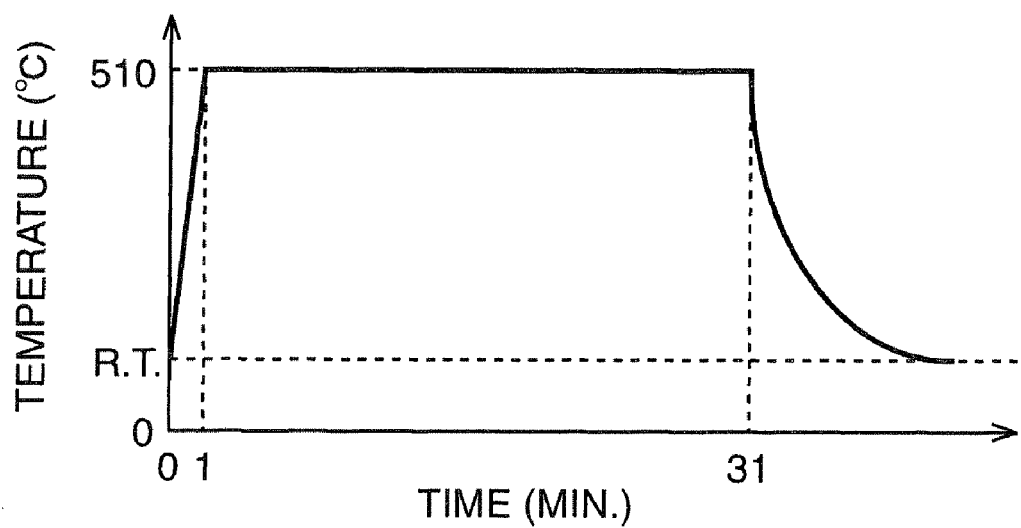
FIG. 2 is a view showing a temperature control in the first embodiment.

Subsequently, carbon nanotubes 17 are grown from the catalytic particles 16 on the catalytic layer 15, as shown in FIG. 1F. When growing the carbon nanotubes 17, the silicon (Si) substrate 11 on which the catalytic layer 15 is formed is delivered into a thermal CVD chamber (not shown) whose internal temperature is, for example, a room temperature (R.T.), and a mixed gas of an inert gas and a raw gas is introduced into the inside thereof. For the mixed gas, a mixed gas of argon and acetylene in which a mixing ratio thereof is 90:10, for example, is used. In other words, a mixed gas in which a raw gas (acetylene gas) is diluted by an inert gas (argon gas) is used. Then, after the pressure inside of the chamber is stabilized at 1 kPa, for example, the temperature inside of the chamber is raised to 510° C. in 1 minute, as shown in FIG. 2. As a result, the carbon nanotubes 17 start to grow linearly from the respective catalytic particles 16 without any fusion of each of the catalytic particles 16.

Next, the temperature and an atmosphere are maintained for about 30 minutes, for example. Once the carbon nanotubes 17 start to grow, surfaces of the catalytic particles 16 are covered by carbon, so that any fusion of each of the catalytic particles 16 can be avoided even during the maintenance for about 30 minutes. Subsequently, when the maintenance is completed, the temperature is lowered to the room temperature, while keeping the atmosphere.

According to the present embodiment as described above, since the catalytic particles 16 are adhered on the catalytic layer 15 and the raw gas is already supplied into the chamber before the heating is started, the carbon nanotubes 17 initiate the growth immediately from the start of the heating. Therefore, the catalytic particles 16 do not fuse together, as described above. Further, since the temperature is raised at high speed, the fusion of each of the catalytic particles 16 can be prevented further securely. As a result, the diameter of the carbon nanotube 17 is determined depending on the diameter of the adhered catalytic particle 16. Further, the present embodiment applies the catalytic particles 16 having the substantially uniform diameters (about 5 nm, for example), so that a variation of the diameters of the carbon nanotubes 17 grown from the catalytic particles 16 also becomes extremely small.

Figure 3:
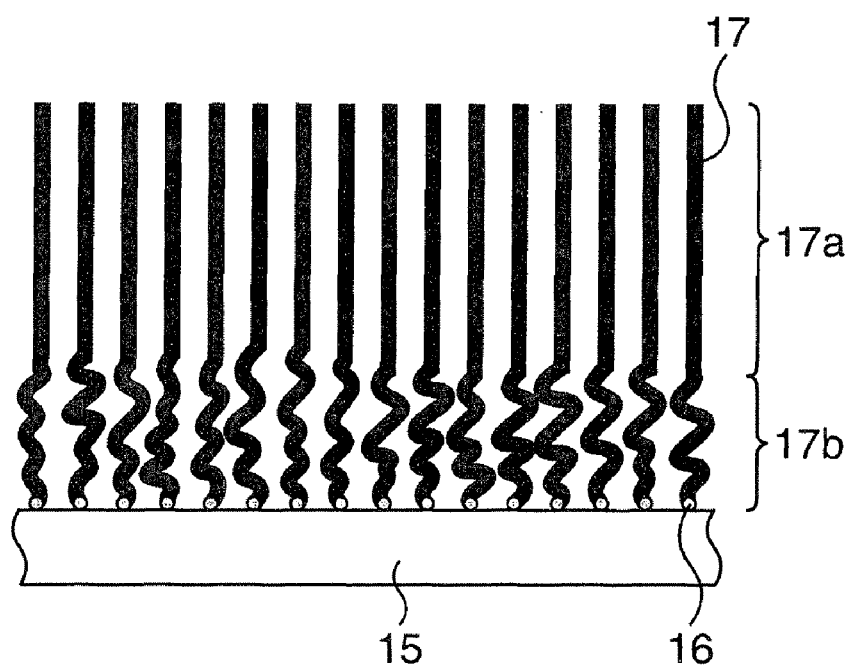
FIG. 3 is a view showing details of carbon nanotubes 17.

Note that, technically speaking, the carbon nanotube 17 which is grown according to the above-described embodiment includes a straight portion 17a and a crimped portion 17b, as shown in FIG. 3. This is because the carbon nanotube 17 grows linearly when raising a temperature at high speed, but it grows while being crimped when maintaining the temperature. When comparing the characteristics of these portions, the straight portion 17a has smaller defects and lower resistance values. Therefore, it is preferable to select a condition under which the straight portion 17a grows longer. According to the results of experiments performed so far by the present inventor, it is favorable to set the pressure inside of the chamber at 0.1 kPa to 30 kPa, and the speed of raising the temperature at 500° C./minute or faster, for example. To conduct spike annealing when raising the temperature is effective. Because when the spike annealing is applied, it is possible to raise the temperature even at a speed of 500° C./second or faster. Further, the period of time taken for raising the temperature is also not limited in particular, and it is set at, for example, more than 30 seconds or more than 1 minute.

Figure 4:
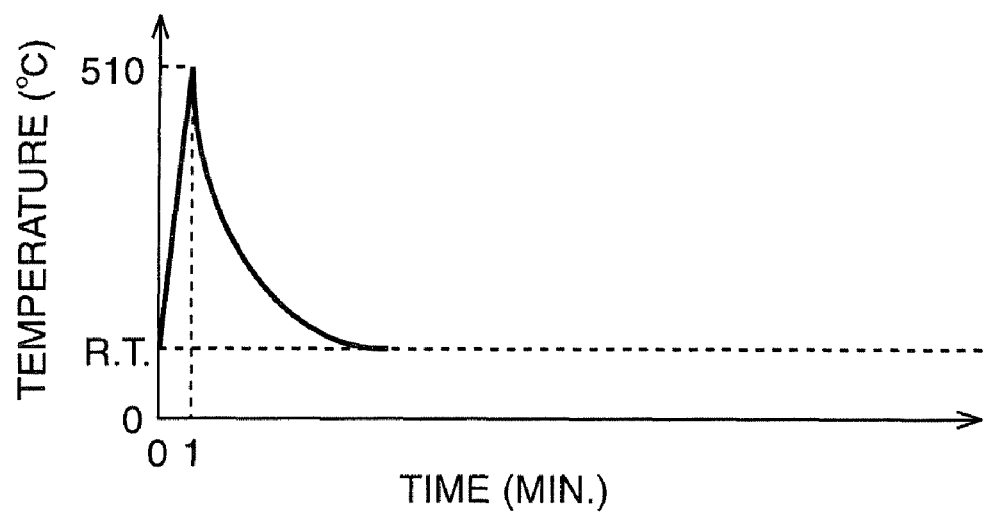
FIG. 4 is a view showing an example of a temperature control.

Further, maintaining the temperature after raising the temperature is unnecessary, so that it is permissible to start to lower the temperature immediately after the completion of raising the temperature, as shown in FIG. 4.

Further, the temperature to be achieved by the high-speed temperature rise may be the one at which the carbon nanotubes can grow, and is set at, for example, 400° C. or higher. The temperature to be maintained thereafter may also be the one at which the carbon nanotubes can grow. However, when portions being vulnerable to heat such as a low dielectric constant film exist on the same substrate, the temperature is preferable to be set at 450° C. or lower.

Further, the raw gas is not limited to the acetylene gas, and various hydrocarbon gases can also be applied.

Further, the catalytic particles may contain titanium (Ti), molybdenum (Mo), palladium (Pd), tantalum (Ta), aluminum (Al), tungsten (W), copper (Cu), vanadium (V), hafnium (Hf) and/or zirconium (Zr), in addition to iron (Fe), cobalt (Co) and/or nickel (Ni). When these elements are contained in the catalytic particles, there is a case that the carbon nanotubes start to grow at a lower temperature.

Figure 10A:
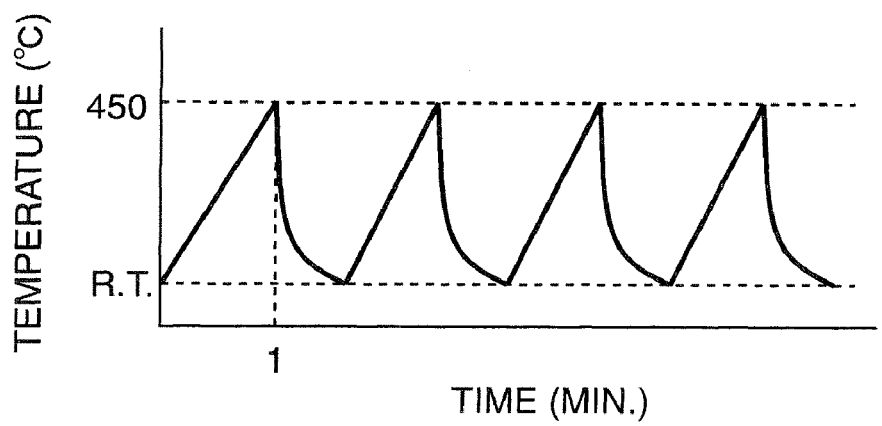
FIG. 10A is a view showing another example of a temperature control.
Figure 10B:
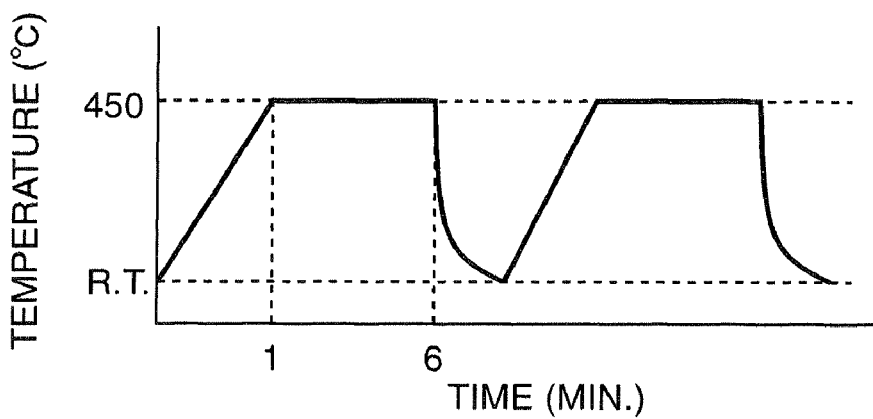
FIG. 10B is a view showing further another example of a temperature control.

Further, when growing the carbon nanotubes, it is permissible to repeatedly perform the treatments of raising the temperature at high speed and lowering the temperature, as shown in FIG. 10A. In this case, the temperature may be maintained between the periods of raising the temperature at high speed and lowering the temperature, as shown in FIG. 10B. By repeatedly conducting such treatments, it is possible to obtain a carbon nanotube having a characteristic varied in a length direction thereof.

Figure 11:
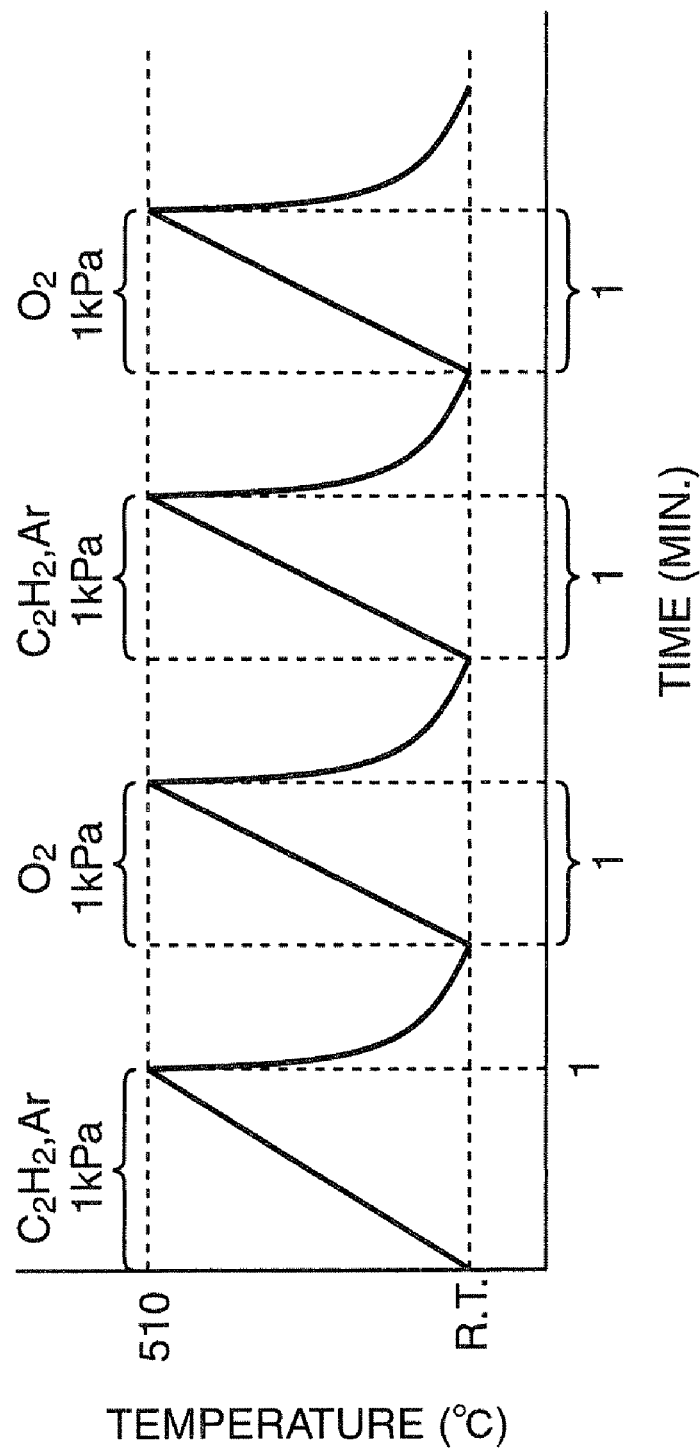
FIG. 11 is a view showing an example of a temperature control and an atmosphere control.

Further, it is also permissible to change the kind of the raw gas, the pressure, the temperature, a temperature gradient and the like in each temperature profile. When applying these conditions, the carbon nanotubes can also be grown by performing a control as shown in FIG. 11.

More specifically, first, a temperature is raised at high speed to 510° C. in 1 minute in a mixed gas (1 kPa) of acetylene ($C_2H_2$) and argon (Ar). As a result, the carbon nanotubes are grown from almost all of the catalytic fine particles, but, there exists some from which the carbon nanotubes are not grown. This is because the catalytic fine particles are covered by carbon before the carbon nanotubes start to grow therefrom. Accordingly, the raw gas is once evacuated and oxygen is newly introduced into the chamber until the pressure in the chamber reaches 1 kPa. Thereafter, the temperature is raised at high speed from the room temperature to 510° C. in 1 minute in the oxygen atmosphere. By conducting this process, the carbon covering the catalytic fine particles is removed.

Subsequently, the temperature is lowered to the room temperature, and again, the temperature is raised at high speed to 510° C. in 1 minute in the mixed gas (1 kPa) of acetylene and argon. As a result, the carbon nanotubes are grown from almost all of the catalytic fine particles from which the carbon nanotubes are not grown at the first time of the high-speed temperature rise.

By repeatedly conducting such processes, it is possible to effectively utilize the catalytic fine particles. In other words, the carbon nanotubes can be grown from almost all of the catalytic fine particles. As a result, it becomes possible to obtain the carbon nanotubes grown in high density that may not be obtained at one time of the high-speed temperature rise. Note that, a condition(s) under which the temperature is raised at high speed and/or the oxidation is performed for the second time or thereafter may vary from that (those) of the first time.

Note that, to construct a carbon nanotube growing system, a unit adhering catalysts (catalyst adhering portion) and a thermal treatment unit performing the high-speed temperature rise (thermal treatment portion) and the like may be provided separately or in combination.

Figure 5A:
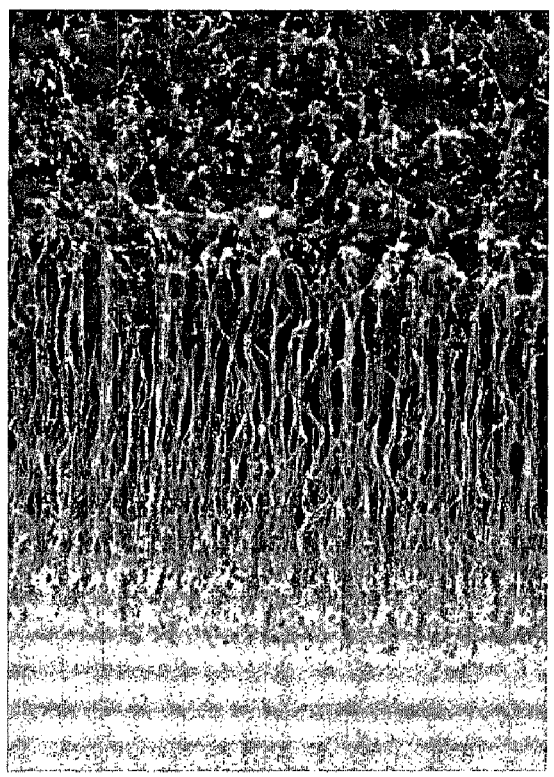
FIG. 5A is a SEM micrograph showing carbon nanotubes grown based on an example No. 1.
Figure 5B:
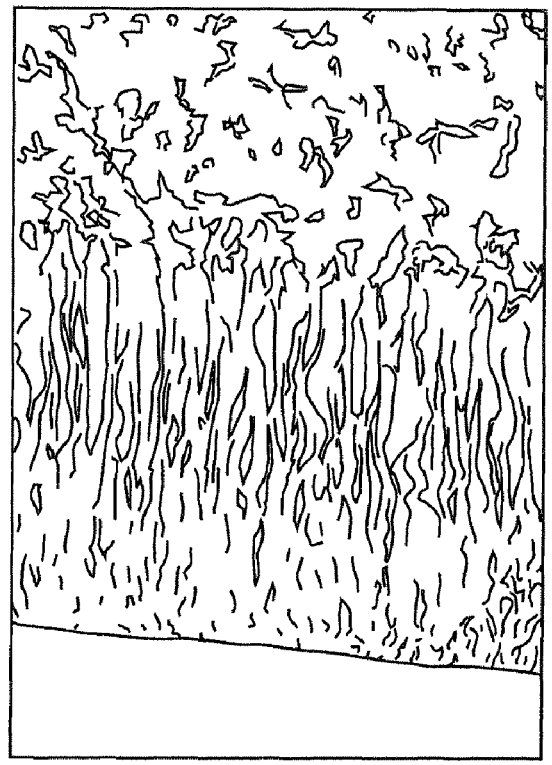
FIG. 5B is a view schematically showing the carbon nanotubes grown based on the example No. 1.
Figure 6A:
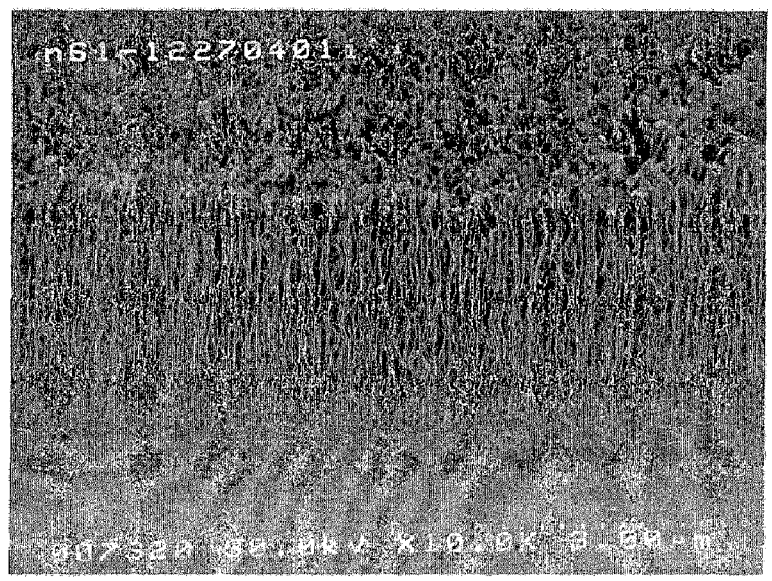
FIG. 6A is an SEM micrograph showing carbon nanotubes grown based on an example No. 2.
Figure 6B:
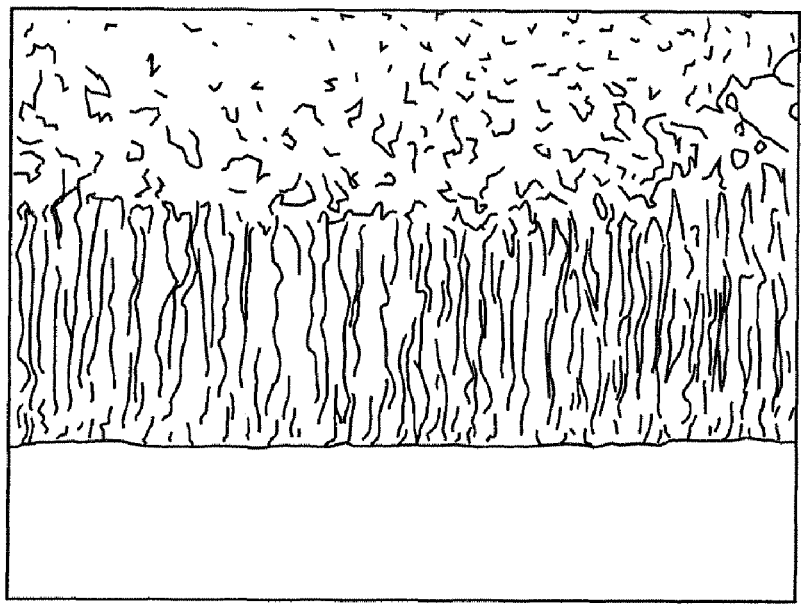
FIG. 6B is a view schematically showing the carbon nanotubes grown based on the example No. 2.
Figure 7A:
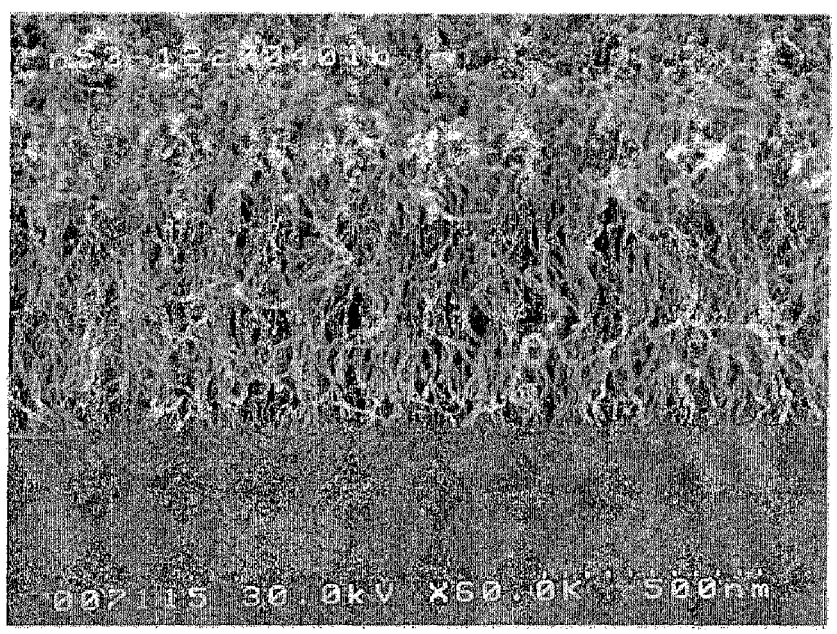
FIG. 7A is an SEM micrograph showing carbon nanotubes grown based on an example No. 3.
Figure 7B:
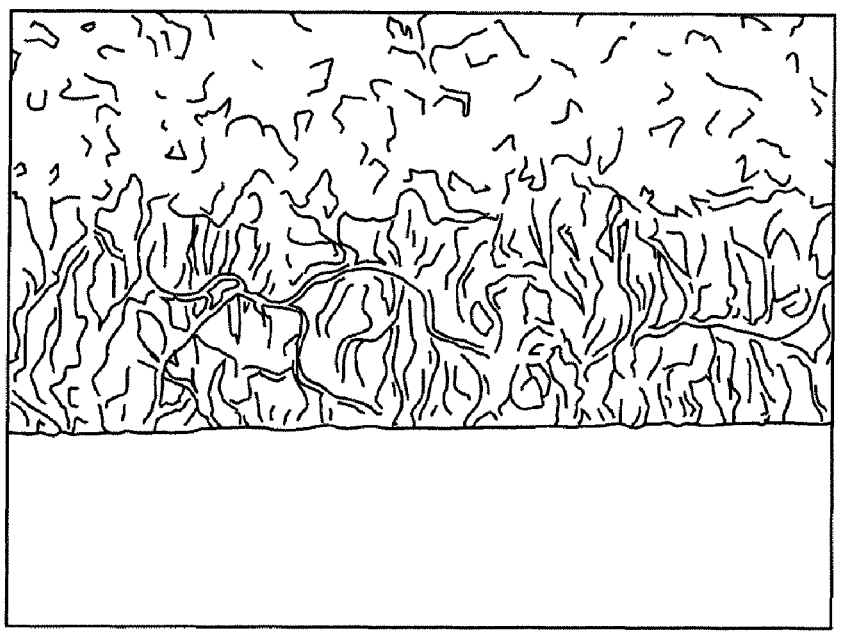
FIG. 7B is a view schematically showing the carbon nanotubes grown based on the example No. 3.
Figure 8:
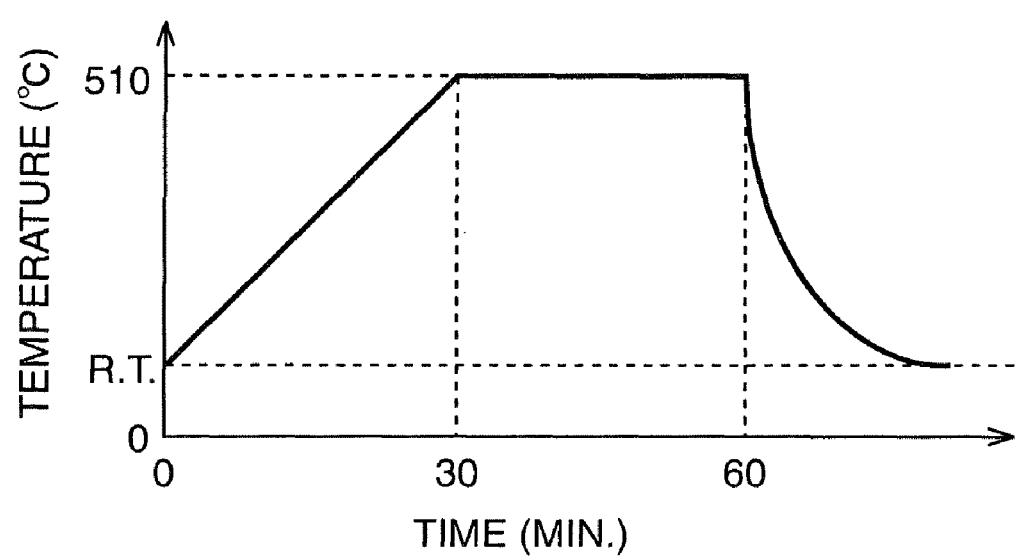
FIG. 8 is a view showing a temperature control in the example No. 3.

Next, SEM micrographs of the carbon nanotubes actually taken by the present inventor are shown in FIG. 5A, FIG. 6A and FIG. 7A. Further, contents of the SEM micrographs shown in FIG. 5A, FIG. 6A and FIG. 7A, respectively, are schematically shown in FIG. 5B, FIG. 6B and FIG. 7B. The carbon nanotubes shown in FIG. 5A and FIG. 5B were grown based on a method according to the above-described embodiment (example No. 1). The carbon nanotubes shown in FIG. 6A and FIG. 6B were grown based on a method according to the above-described embodiment in which a pressure in the chamber was changed (example No. 2). In the example No. 2, the pressure in the chamber was set at 10 kPa. The carbon nanotubes shown in FIG. 7A and FIG. 7B were grown based on a method according to the above-described embodiment in which a temperature control was changed (example No. 3). In the embodiment No. 3, after the pressure inside of the chamber was stabilized at 1 kPa, the temperature in the chamber was raised to 510° C. in 30 minutes, as shown in FIG. 8.

As is confirmed by comparing the carbon nanotubes shown in FIG. 5A and FIG. 5B with the carbon nanotubes shown in FIG. 6A and FIG. 6B, as the pressure became higher, the carbon nanotubes with longer straight portions were obtained.

Further, as is confirmed by comparing the carbon nanotubes shown in FIG. 5A and FIG. 5B with the carbon nanotubes shown in FIG. 7A and FIG. 7B, as the speed of raising the temperature became faster, the carbon nanotubes with longer straight portions were obtained. Note that also in the carbon nanotubes shown in FIG. 7A and FIG. 7B, an effect in which the diameter variation thereof was small was obtained.

Second Embodiment

Next, a second embodiment will be explained. FIGS. 9A to 9D are sectional views showing a method of growing carbon nanotubes according to the second embodiment in order of step.

Figure 9A:
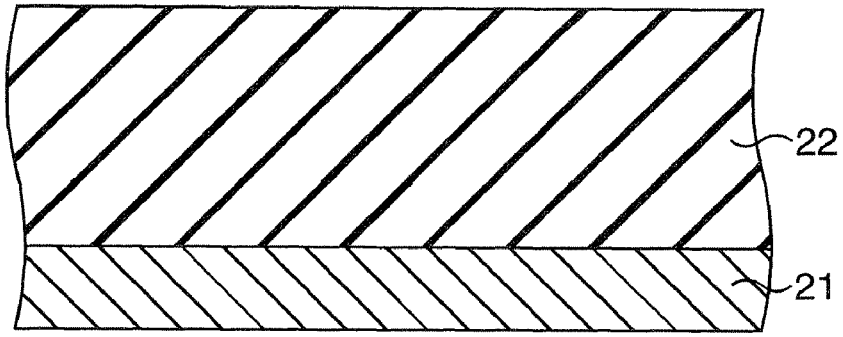
FIG. 9A is a sectional view showing a method of growing carbon nanotubes according to a second embodiment.

In the present embodiment, first, a silicon oxide ($SiO_2$) film 22 is formed on a silicon (Si) substrate 21, as shown in FIG. 9A. A thickness of the silicon oxide ($SiO_2$) film 22 is, for example, about 350 nm.

Figure 9B:
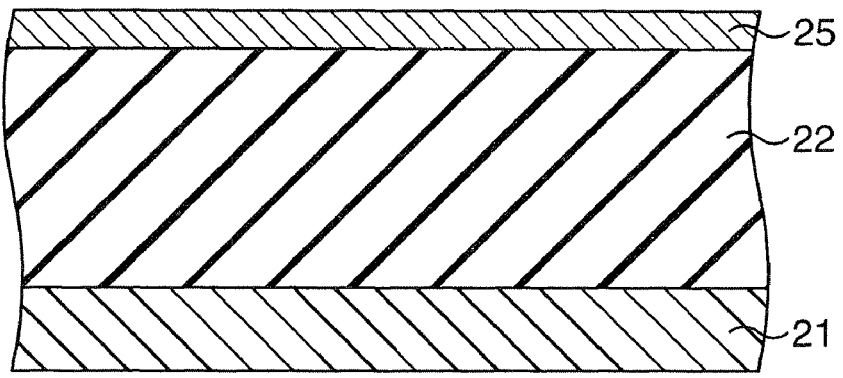
FIG. 9B is a sectional view showing the method of growing carbon nanotubes following FIG. 9A.

Next, a catalytic layer 25 is formed on the silicon oxide ($SiO_2$) film 22, as shown in FIG. 9B. As the catalytic layer 25, a titanium (Ti) film having about 1 nm in thickness, for example, is formed.

Figure 9C:
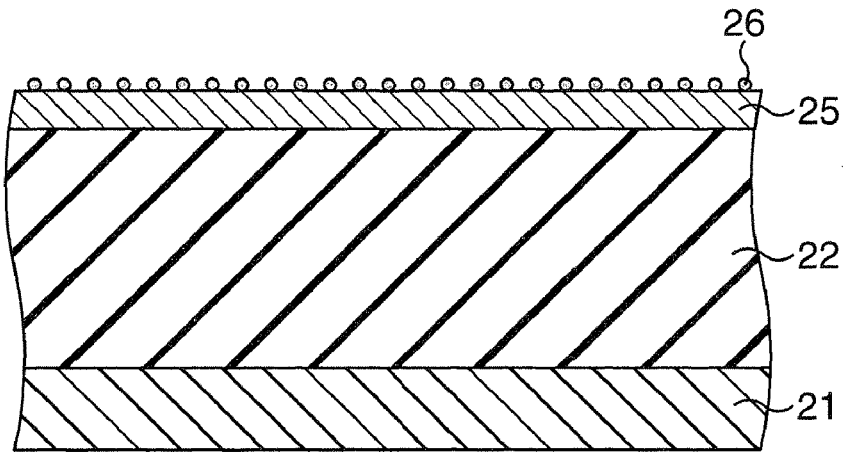
FIG. 9C is a sectional view showing the method of growing carbon nanotubes following FIG. 9B.

Subsequently, a plurality of catalytic particles 26 having substantially uniform diameters are adhered on the catalytic layer 25, as shown in FIG. 9C. The catalytic particle 26 has a diameter of, for example, 5 nm or smaller. As the catalytic particles 26, cobalt (Co) particles, nickel (Ni) particles, or iron (Fe) particles are used, for example. Further, alloy particles of these elements may also be used. A method for adhering the catalytic particles 26 is not limited in particular. For example, the method described in Japanese Patent Application Laid-open No. 2005-22886 may be applied, similar to the first embodiment.

Figure 9D:
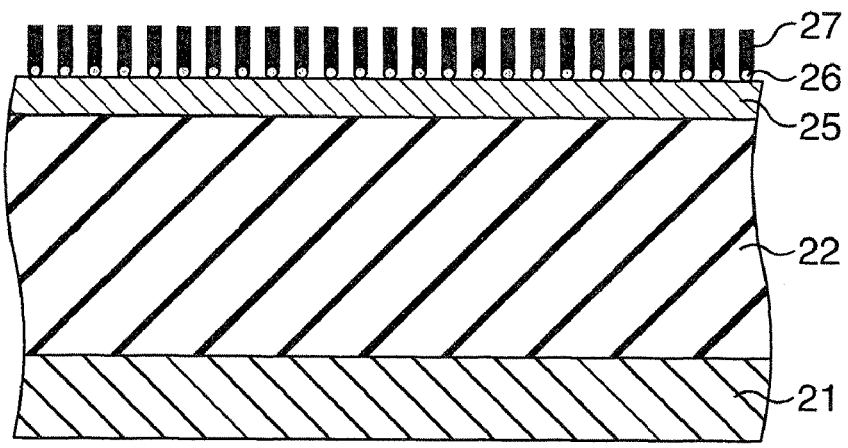
FIG. 9D is a sectional view showing the method of growing carbon nanotubes following FIG. 9C.

Thereafter, carbon nanotubes 27 are grown from the catalytic particles 26 on the catalytic layer 25, as shown in FIG. 9D. The carbon nanotubes 27 can be grown using a similar method as is used for growing the carbon nanotubes 17 in the first embodiment.

Also in the second embodiment as described above, the same effect as in the first embodiment can be obtained.

What is claimed is:

1. A method of growing a carbon nanotube, comprising:
adhering catalytic particles to an upper surface of a substrate;
introducing a raw gas containing carbon atoms in a chamber at below 400° C.;
after introducing the raw gas, starting raising a substrate temperature at a speed of 500° C./minute or faster in the chamber with the raw gas previously introduced therein.

2. A method of growing a carbon nanotube, comprising:
first raising of a substrate temperature in a chamber with a raw gas containing carbon atoms previously introduced therein; and
second raising of the substrate temperature in the chamber with an oxidizing gas previously introduced therein,
wherein said first and second raising of the substrate temperature are repeatedly conducted,
wherein said first raising comprising:
introducing the raw gas in the chamber at below 400° C.;
after introducing the raw gas, starting raising the substrate temperature, and
wherein said second raising comprising:
introducing the oxidizing gas in the chamber;
after introducing the oxidizing gas, starting raising the substrate temperature.

3. The method of growing a carbon nanotube according to claim 1, wherein raising the substrate temperature is continued until the substrate temperature reaches 400° C. or higher.

4. The method of growing a carbon nanotube according to claim 1, wherein raising the substrate temperature is continued for 30 seconds or longer.

5. The method of growing the carbon nanotube according to claim 1, wherein a diameter of the catalytic particle is 5 nm or smaller.

6. The method of growing a carbon nanotube according to claim 1, wherein the catalytic particle contains at least one kind selected from the group consisting of iron (Fe), cobalt (Co) and nickel (Ni).

7. The method of growing a carbon nanotube according to claim 6, wherein the catalytic particle further contains at least one kind selected from the group consisting of titanium (Ti), molybdenum (Mo), palladium (Pd), tantalum (Ta), aluminum (Al), tungsten (W), copper (Cu), vanadium (V), hafnium (Hf) and zirconium (Zr).

8. The method of growing a carbon nanotube according to claim 1, wherein a hydrocarbon gas is used as the raw gas.

9. The method of growing a carbon nanotube according to claim 1, wherein the raw gas is diluted by an inert gas.

10. The method of growing a carbon nanotube according to claim 1, wherein a pressure in the chamber during said step of raising the substrate temperature is set at 0.1 kPa to 30 kPa.

11. The method of growing a carbon nanotube according to claim 1, further comprising maintaining the substrate temperature at which the carbon nanotube can grow, after said raising the substrate temperature.

12. The method of growing a carbon nanotube according to claim 11, wherein a temperature is maintained at 450° C. or lower in said maintaining the substrate temperature.

13. The method of growing a carbon nanotube according to claim 1, wherein the raw gas is introduced at a substantial room temperature.

* * * * *